(12) United States Patent
Liu et al.

(10) Patent No.: US 7,705,298 B2
(45) Date of Patent: Apr. 27, 2010

(54) SYSTEM AND METHOD TO DETERMINE FOCUS PARAMETERS DURING AN ELECTRON BEAM INSPECTION

(75) Inventors: Xuedong Liu, Cupertino, CA (US);
Zhonghua Dong, Sunnyvale, CA (US);
Wei Fang, Milpitas, CA (US);
Zhong-Wei Chen, San Jose, CA (US)

(73) Assignee: Hermes Microvision, Inc. (Taiwan), Hsin-Chu (TW)

( * ) Notice: Subject to any disclaimer, the term of this patent is extended or adjusted under 35 U.S.C. 154(b) by 365 days.

(21) Appl. No.: 11/939,530

(22) Filed: Nov. 13, 2007

(65) Prior Publication Data

US 2009/0108199 A1 Apr. 30, 2009

Related U.S. Application Data

(60) Provisional application No. 60/983,133, filed on Oct. 26, 2007.

(51) Int. Cl.
*H01J 37/28* (2006.01)
*H01J 37/21* (2006.01)
*H01J 3/14* (2006.01)

(52) U.S. Cl. ............... 250/306; 250/307; 250/310; 250/396 R; 250/492.2; 250/492.3

(58) Field of Classification Search ............ 250/306, 250/307, 310, 396 R, 492.2, 492.3
See application file for complete search history.

(56) References Cited

U.S. PATENT DOCUMENTS

| 6,130,432 | A  | * | 10/2000 | Pfeiffer et al. ......... 250/396 ML |
| 6,452,178 | B2 |   | 9/2002  | Iwabuchi et al. |
| 6,521,891 | B1 |   | 2/2003  | Dotan et al. |
| 6,979,820 | B2 |   | 12/2005 | Ke et al. |
| 7,109,483 | B2 | * | 9/2006  | Nakasuji et al. ............ 250/310 |
| 2008/0006771 | A1 | * | 1/2008 | Tseng et al. ............... 250/307 |
| 2008/0121810 | A1 | * | 5/2008 | Liu et al. ............. 250/396 ML |
| 2009/0294664 | A1 | * | 12/2009 | Chen et al. ............... 250/310 |

* cited by examiner

*Primary Examiner*—Nikita Wells
(74) *Attorney, Agent, or Firm*—Sawyer Law Group, P.C.

(57) ABSTRACT

This invention relates to apparatus and method to fast determine focus parameters in one pre-scan during an e-beam inspection practice. More specifically, embodiments of the present invention provide an apparatus and method that provide accurate focus tuning after primary focusing has been done.

10 Claims, 6 Drawing Sheets

SYSTEM AND METHOD TO DETERMINE FOCUS PARAMETERS DURING AN ELECTRON BEAM INSPECTION

FIELD OF THE INVENTION

The present invention relates generally to electron beam (e-beam) scanning and more particularly relates to apparatus and method to determine focus parameters in one pre-scan during an e-beam inspection.

BACKGROUND

Fabrication of semiconductor device such as logic and memory device may include processing wafer through various semiconductor processing tools. As feature sizes continuously shrink, for example, from 45 nm to 32 nm, processing parameters such as focus accuracy become critical for lithography and metrology tools. The image focusing in an e-beam inspection practice is mainly through the objective lens. Many auxiliary lens have been adopted to determine the position of the specimen surface to fine tune the image focus. The most popular method adopted in e-beam inspection tool to assist system focusing is laser related auxiliary focus. However, the detecting accuracy of laser is limited within the range of 0.5 µm to 0.01 µm due to wafer surface pattern diffraction. Other conventional accuracy methods take a series of e-beam images that not only take a long time but also may contaminate the processing wafer.

Therefore, an improved system and method for fast respond lens and high speed focusing check is desired. The present invention addresses such a need.

BRIEF SUMMARY OF THE INVENTION

An object of the present invention is to provide a fast response focusing auxiliary with ferrite core, position below aperture and above in-lens detector, with ability to very the e-beam focusing on the specimen surface from the z-direction ±3 to 5 µm.

Another object of this invention is to provide a method to determine the accurate focusing parameter within one 3 dimensional scan in a small area.

And yet another object of this invention is to provide a method to integrate the focusing parameters of small area to form focusing for large field of view (FOV).

DETAILED DESCRIPTION OF THE INVENTION

The present invention relates generally to electron beam scanning and more particularly relates to apparatus and method to determine focus parameters in one pre-scan during an e-beam inspection. More specifically, embodiments of the present invention provide an apparatus and method that provide accurate focus tuning after primary focusing has been done. Merely by way of example, the present invention has been used onto a low-landing scanning electron microscope, but it would be recognized that the invention has a much broader range of applicability. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
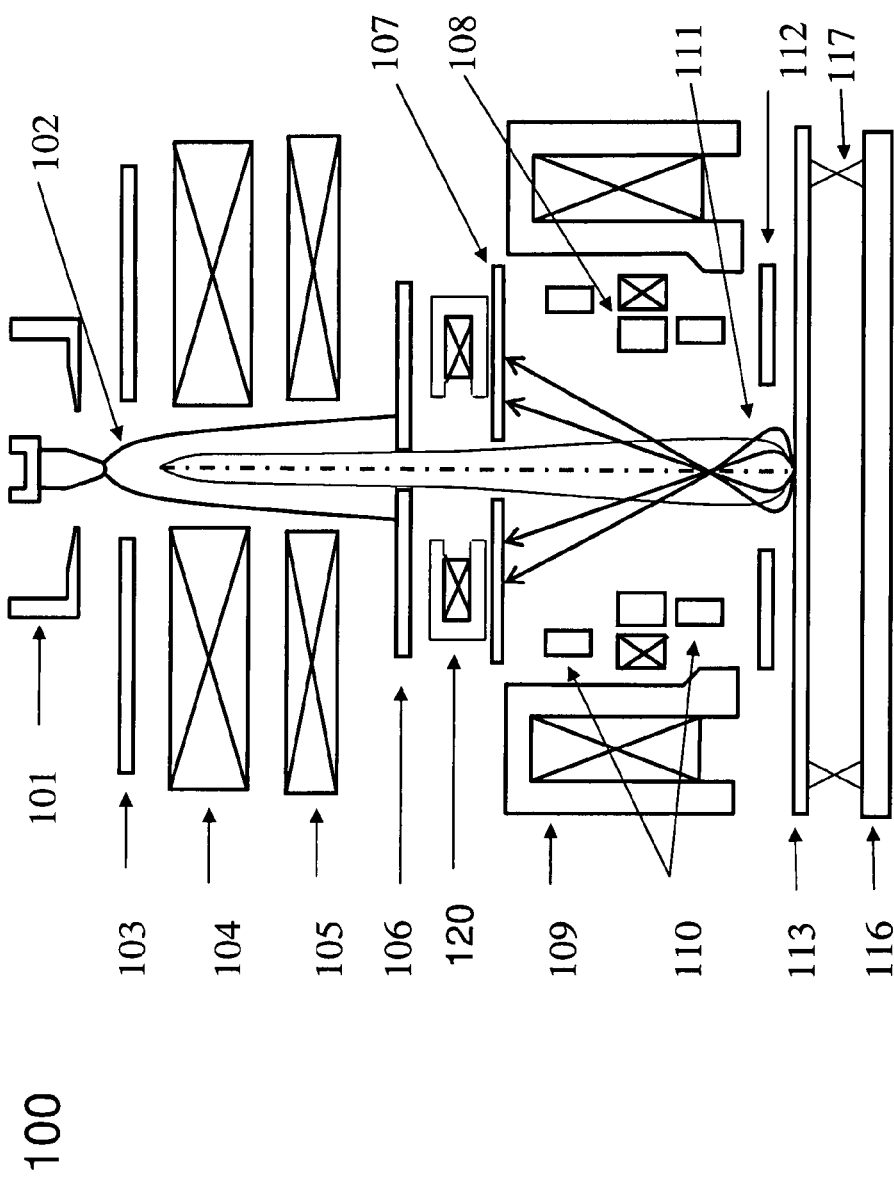
FIG. 1 is a simplified diagrammatic representation of an e-beam system in accordance with an embodiment of the present invention.

FIG. 1 is a simplified diagrammatic representation of an e-beam system in accordance with an embodiment of the present invention. This diagram is merely an example, which should not unduly limit the scope of the claims. One of ordinary skill in the art would recognize many variations, alternatives, and modifications. The electron beam system (100) comprises an electron source (101) for generating a primary electron beam (102) onto a specimen (113), and a condenser lens (103, 104 and 105) for pre-focusing the primary electron beam (102), which can also form a crossover if necessary. The electron beam system (100) also includes an objective lens (109 and 112) for forming the magnetic field and the electrostatic field to focus the primary electron beam (102) onto the specimen (113) along the electron beam path. The system 100 also includes a detection system 107 for detecting electrons (111) emanating from the specimen (113) by the impingement of focused primary electron beam (102) on the specimen (113); and a deflection system (110) for deflecting the primary electron beam (102) over the specimen (113) to form a scanning pattern. The electron beam system (100) also includes an ExB alignment unit (108) for aligning the optical axis of the charged particle beam (111) released from the specimen (113) with the optical axis of the primary electron beam (102); and an X-Y stage (116) and a Z stage (117) for moving the specimen (113) to the axial area and adjusting the specimen height to the focused-imaging plane of the primary electron beam (102). Finally, the electron beam system (100) includes a fast respond focus auxiliary lens (120) for varying the e-beam focusing position along the z direction.

The condenser lens 104 and 105 could be an astigmatism corrector and/or beam blanker module; 106 is an objective aperture; 107 which confines the beam is an in-lens detector; and 110 is an in-lens deflector.

During a wafer inspection, the electron beam system (100) is required to maintain the focus and positional accuracy of the beam at the target substrate at a very high accuracy over the entire field of view (FOV). As the specimen is mechanically moved under the beam from field to field, the height of the target may vary by a significant amount (several microns) which requires that the beam be refocused. This focus change must be accomplished at high speed without beam motion, which may upset the location accuracy. The beam is typically centered in the main focus lenses, but their inductance is too high to be used for fast adjustment. One embodiment introduces a small auxiliary lens with ferrite core to make this small focus correction. Since the ferrite has negligible hysteresis and eddy current effects, the field of auxiliary lens does the focus adjustment and does not affect the primary beam position.

Figure 2:
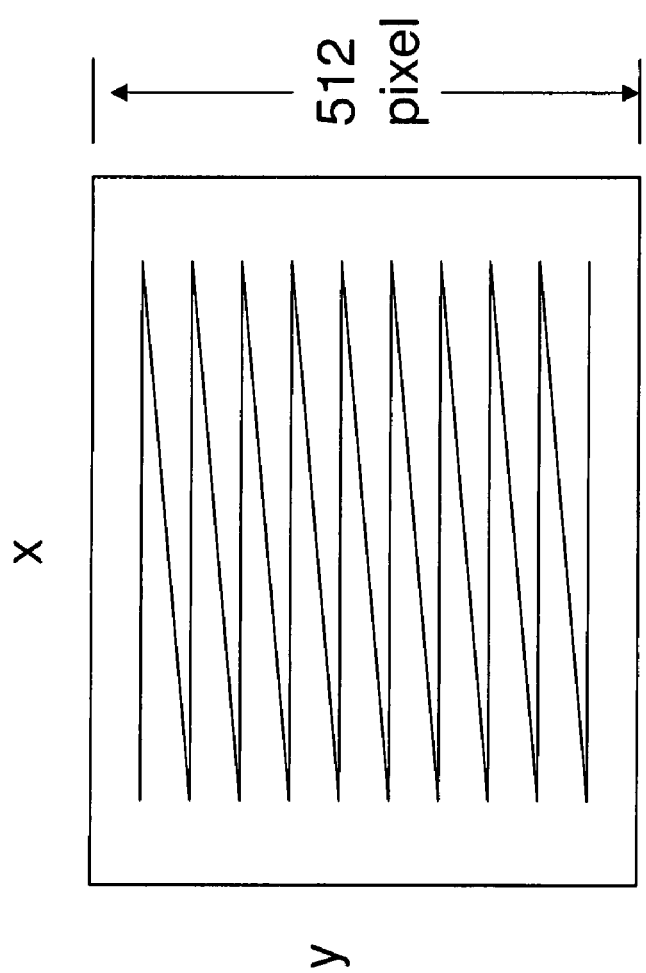
FIG. 2 is a simplified diagrammatic representation of an e-beam scanning pattern in x-y direction in accordance with an embodiment.
Figure 3:
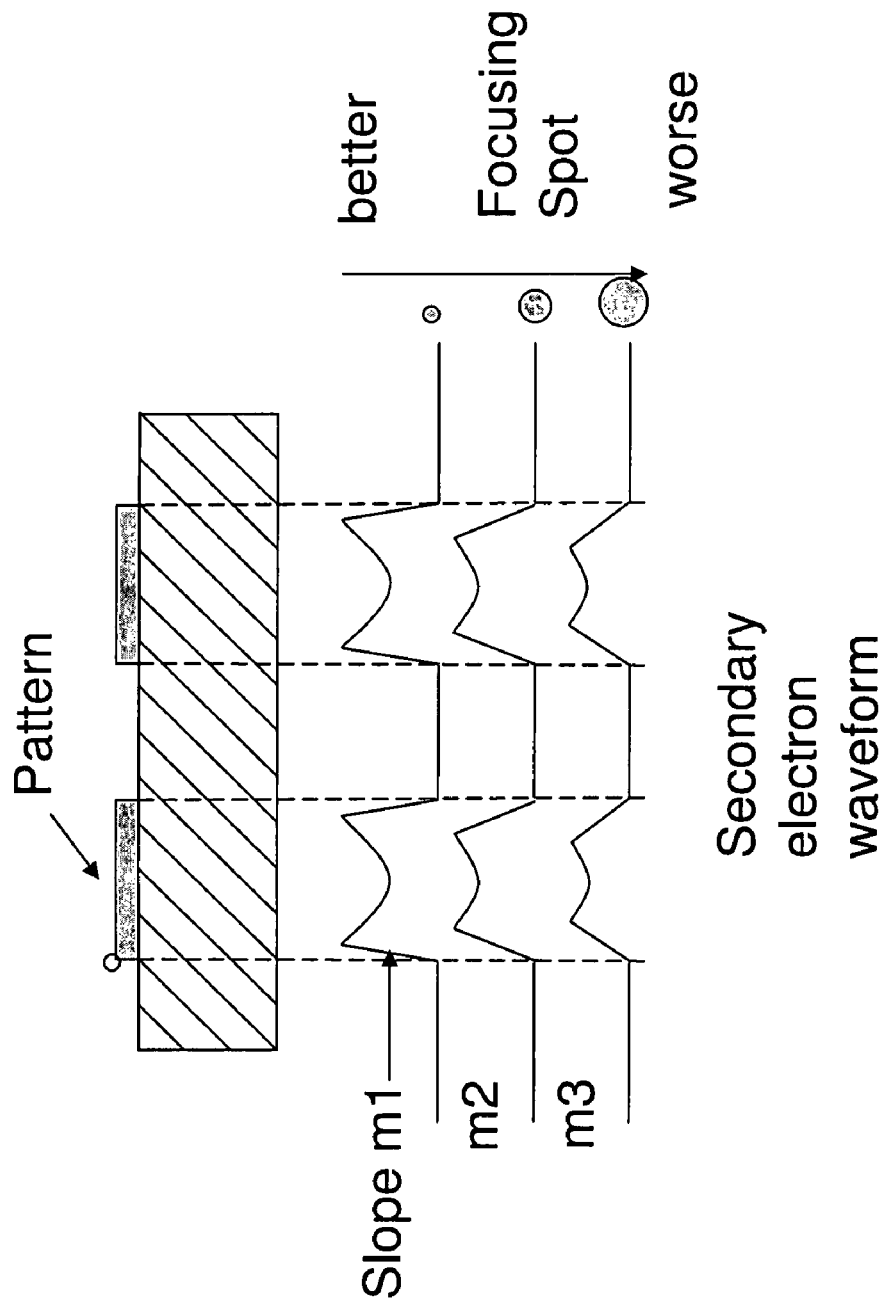
FIG. 3 is a simplified diagrammatic representation of a secondary electron waveform, slope of the waveform and focusing condition detected from specimen surface while e-beam scanning through surface pattern in accordance with an embodiment.

FIG. 2 illustrates a typical x-y direction scan pattern in a 512×512 pixel field of view. To verify the focusing condition of the scan image, examine the respond of secondary electron waveform is one of the many methods. While the electron beam scans cross the pattern features, the detected secondary electron waveform varies and forms a plateau as the FIG. 3 illustrates. The slope of the plateau (m) is related to the focus situation. The sharper the focus, the larger the slope is measured. The average slope ($M_{ave}$) per pixel was calculated during the x-y direction scan.

In conventional practice, research for the best focus condition, may require repeated scans over a same FOV, thus not only contaminating the inspecting area but also inducing a charging effect on the FOV. One embodiment introduces x (position), y (position) and z (focusing current) 3-dimensional scan to check the focusing condition. The 3-dimensional scanning method is introduced as following: Utilizing the characteristic of the fast response auxiliary lens, a pre-scan is performed on a predetermined position within or close to the interested FOV. Secondary electron waveform data are collected, while varying the focusing current of the auxiliary lens during the x-y direction scan, the focusing length above the surface is also measured.

Figure 4:
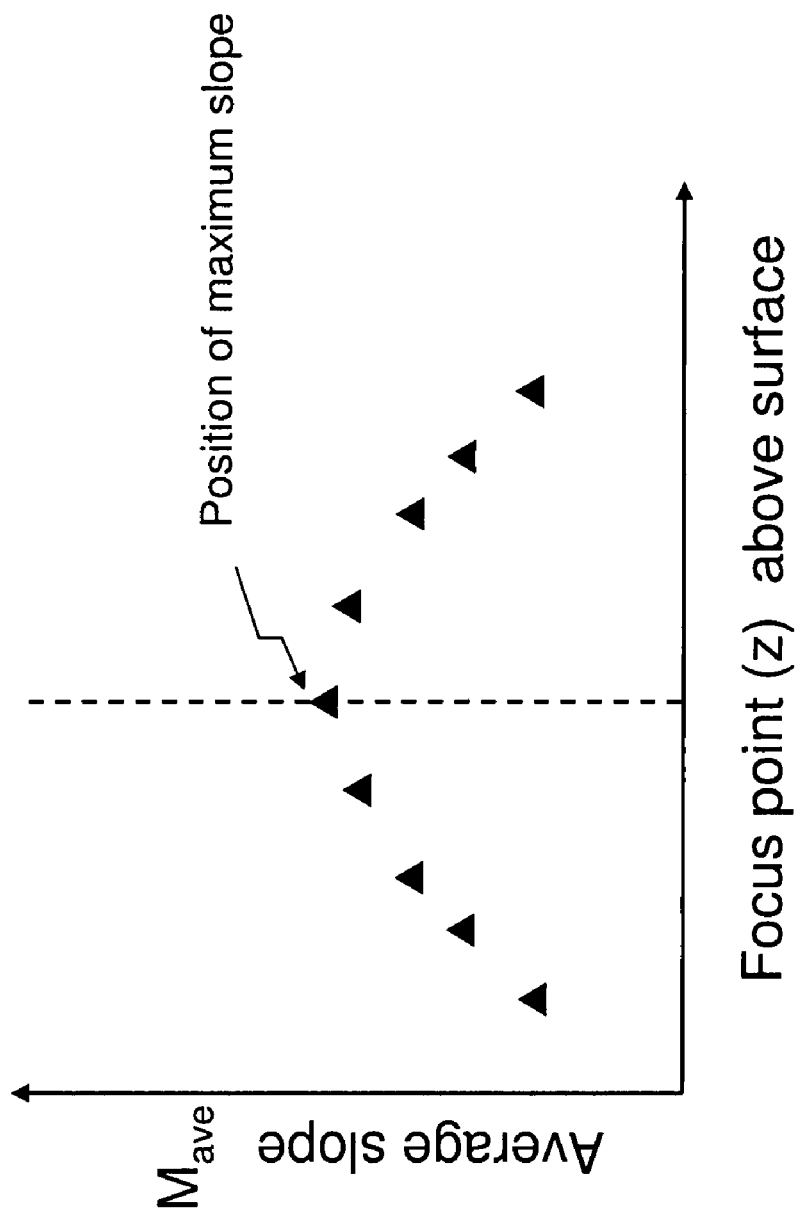
FIG. 4 is a simplified diagrammatic representation of the relationship of average waveform slope and the focus point above the specimen surface in accordance with an embodiment.

FIG. 4 denotes the relationship between the average slope and the focus point above the wafer surface. As the focusing current of the auxiliary lens varies, the beam the focus situation can reveal on the variation of the spot size on the edge of the pattern. The smaller the spot size on the specimen surface represents the sharper focusing of the image.

Figure 5:
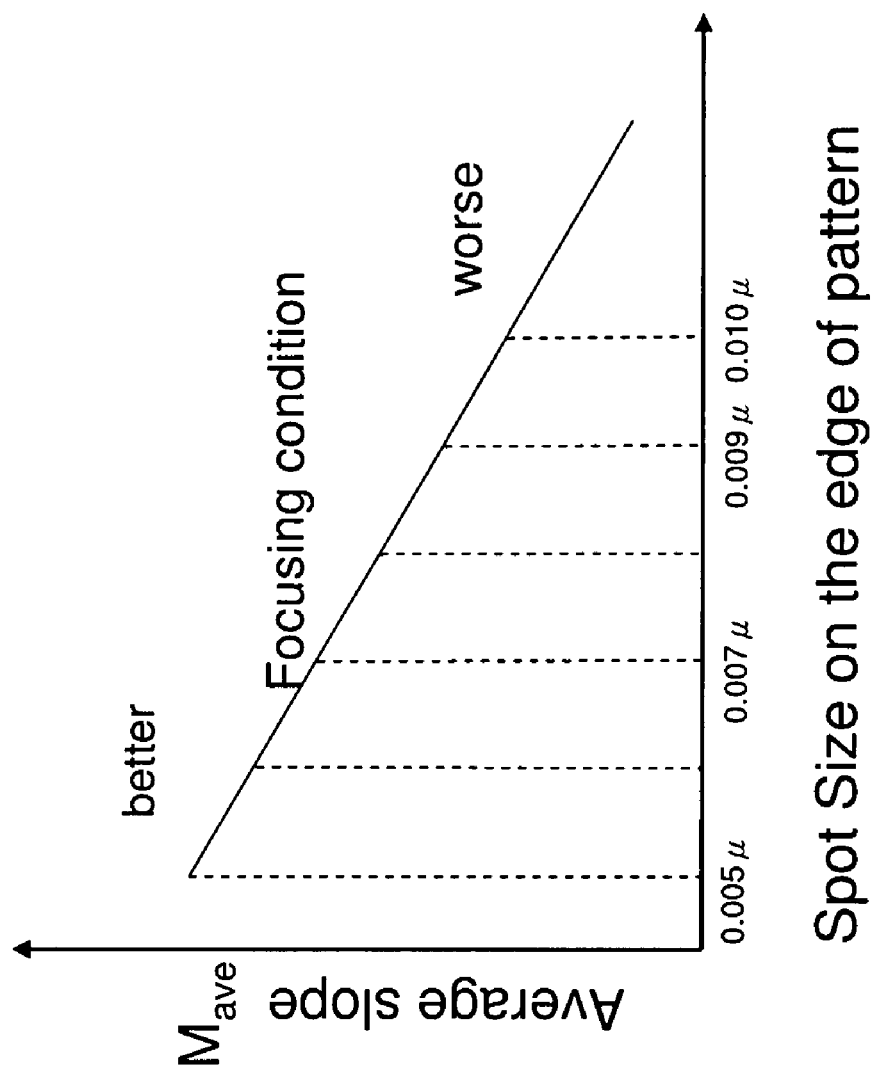
FIG. 5 is a simplified diagrammatic representation of the average waveform slop and the spot size on the edge of pattern in accordance with an embodiment.

FIG. 5 illustrates the variation between the focusing and the average secondary electron waveform slope. Examining the xyz scan image, the best focus point coordinate (x,y) can be located. Then the best focus current of the auxiliary lens according to the (x,y) can also be determined. The focus current of the auxiliary lens is then fixed as the correction parameter for the best image in this field of view.

Figure 6:
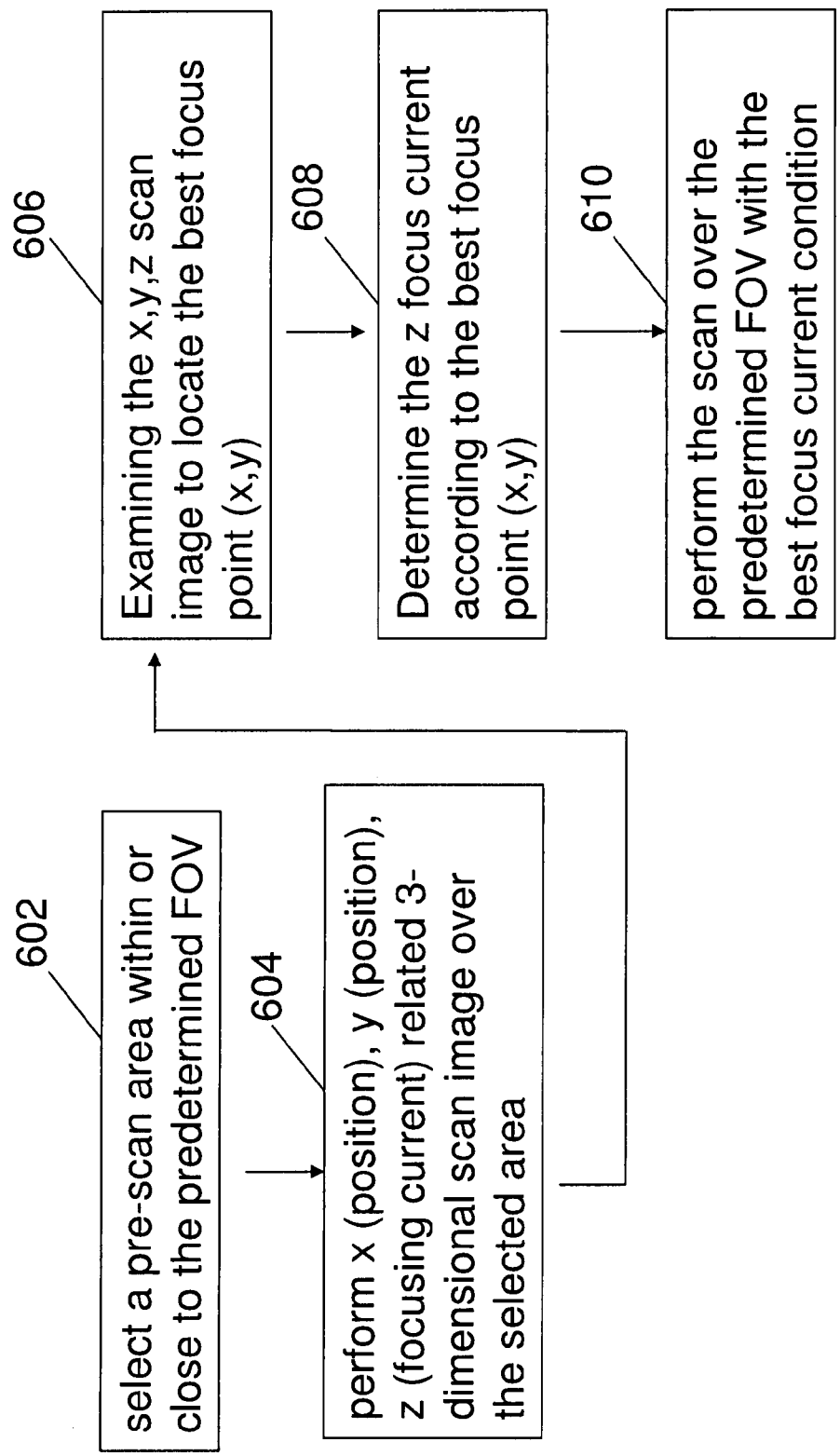
FIG. 6 is a flowchart from determining the best focus condition for the predetermined FOV in accordance with the present invention.

FIG. 6 illustrates the flowchart to determine the best focusing current condition for the predetermined FOV. First, a pre-scanned area within or close to the predetermined FOV is selected, via step (602). Next, an x (position), y (position), z (focusing current) related 3-dimensional scan image over the selected area is performed, via step (604). Then, the x, y, z scan image is examined to locate the best focus point (x,y), via step (606). Next, the z focus current is determined according to the best focus point (x,y), via step (608). Finally, the scan is performed over the predetermined FOV one line with the best focus current condition, via step (610).

The system can be controlled manually or through the use of a processing system. The processing system, for example, could include a software program that utilizes computer readable medium to control the various parts of the system.

The method of verifying focusing condition presented above is merely one of preferred embodiment, other methods to approach the best focus condition, such as comparing the high frequency signal of the image responds to the variation of focus current of the auxiliary lens, are also include in this invention's range applicability.

Although the present invention has been described in accordance with the embodiments shown, one of ordinary skill in the art will readily recognize that there could be variations to the embodiments and those variations would be within the spirit and scope of the present invention. For example, although the splice is preferably made of a conductive material such as aluminum, it could be made utilizing a non-conductive material which has a conductive capability added to its surface and its use would be within the spirit and scope of the present invention. Accordingly, many modifications may be made by one of ordinary skill in the art without departing from the spirit and scope of the appended claims.

What is claimed is:

1. An electron beam apparatus, comprising:
   an electron source for generating a primary electron beam;
   at least one condenser lens for pre-focusing the primary electron beam;
   an objective lens for forming an magnetic field and an electrostatic field to focus the primary electron beam onto a specimen in the electron beam path;
   a detection system for detecting signal electrons emanated from the specimen;
   a deflection system for deflecting the primary electron beam over surface of the specimen to form a scanning pattern;
   wherein a scan is performed over a predetermined field of view with the best focus current condition;
   a stage system for supporting and moving the specimen; and
   a fast respond auxiliary lens for varying the e-beam focusing position along the z direction.

2. The auxiliary lens of claim 1, wherein core material of the auxiliary lens is a low hysteresis material.

3. The auxiliary lens of claim 2, wherein the low hysteresis material is ferrite.

4. The method of claim 3 wherein the scan is performed one time.

5. The auxiliary lens of claim 1 wherein a scan can be performed over a field of view (FOV) on one line.

6. A method of determining the best focus condition in a predetermined field of view (FOV), comprising:
   select a pre-scan area within or close to the predetermined FOV;
   utilize auxiliary lens and deflection system perform x (position), y (position) and z (focusing current) 3-dimensional scan image over the selected area;
   examining the xyz scan image to locate the best focus point (x,y);
   determine the z focus current according to the best focus point (x,y); and
   perform the scan over the predetermined FOV with the best focus current condition.

7. A computer readable medium containing program instructions for determining the best focus condition in a predetermined field of view (FOV), the program instructions for:
   select a pre-scan area within or close to the predetermined FOV;
   utilize auxiliary lens and deflection system perform x (position), y (position) and z (focusing current) 3-dimensional scan image over the selected area;

examining the xyz scan image to locate the best focus point (x,y);
determine the z focus current according to the best focus point (x,y); and
perform the scan over the predetermined FOV with the best focus current condition.

8. The computer readable medium of claim 7, wherein core material of the auxiliary lens is a low hysteresis material.

9. The computer readable medium of claim 8, wherein the low hysteresis material is ferrite.

10. The computer readable medium of claim 7, wherein a scan can be performed over a field of view (FOV) on one line.

* * * * *